US011211111B1

(12) United States Patent
Mathur et al.

(10) Patent No.: US 11,211,111 B1
(45) Date of Patent: Dec. 28, 2021

(54) CAM DEVICE WITH 3D CAM CELLS

(71) Applicant: Arm Limited, Cambridge (GB)

(72) Inventors: Rahul Mathur, Austin, TX (US);
Mudit Bhargava, Austin, TX (US);
Supreet Jeloka, Austin, TX (US);
Andy Wangkun Chen, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/038,795

(22) Filed: Sep. 30, 2020

(51) Int. Cl.
| | | |
|---|---|---|
| *G11C 11/40* | (2006.01) | |
| *G11C 11/4076* | (2006.01) | |
| *G11C 11/4094* | (2006.01) | |
| *G11C 5/02* | (2006.01) | |
| *G11C 15/04* | (2006.01) | |
| *G11C 11/4097* | (2006.01) | |

(52) U.S. Cl.
CPC .......... *G11C 11/4076* (2013.01); *G11C 5/025* (2013.01); *G11C 11/4094* (2013.01); *G11C 11/4097* (2013.01); *G11C 15/04* (2013.01)

(58) Field of Classification Search
CPC ..... G11C 11/4076; G11C 5/025; G11C 15/04; G11C 11/4097; G11C 11/4094; G06F 16/90339
See application file for complete search history.

(56) References Cited

U.S. PATENT DOCUMENTS

| | | | | |
|---|---|---|---|---|
| 6,781,857 B1* | 8/2004 | Lien | ....................... | G11C 15/00 365/189.07 |
| 10,998,047 B1* | 5/2021 | Li | ......................... | G11C 15/046 |
| 2011/0051484 A1* | 3/2011 | Chu | ...................... | G11C 15/04 365/49.12 |
| 2015/0332767 A1* | 11/2015 | Arsovski | ................ | G11C 15/04 365/49.17 |
| 2016/0140243 A1* | 5/2016 | Adams | ................. | G06F 16/9535 707/706 |

OTHER PUBLICATIONS

Content-Addressable Memory (CAM) Circuits and Architectures: A Tutorial and Survey IEEE Journal of Solid-State Circuits, vol. 41, No. 3, Mar. 2006.

* cited by examiner

*Primary Examiner* — Ajay Ojha
(74) *Attorney, Agent, or Firm* — Quinn IP Law

(57) ABSTRACT

A content-addressable memory (CAM) storage element includes bit storage cell bit comparison cells. The bit storage cell is arranged on a first die tier and includes at least one transistor, one or two bit lines, and a storage node. The bit comparison cell is arranged on a second die tier and has a match line, complementary search lines, and at least three transistors. The complementary search lines are decoupled from the bit line(s). A 3D connection couples the storage node to one of the transistors of the second die tier. The CAM cell performs at least one CAM search per clock cycle using at least four transistors per search, including the at least one transistor of the bit storage cell and the at least three transistors of the bit comparison cell, and to output results of the at least one CAM search on the match line.

20 Claims, 11 Drawing Sheets

| Config | Searches | Tier 0 | Tier 1 | Tier 2 | 3D Conn |
|---|---|---|---|---|---|
| 14 - A | 1 | 6T | 3T | - | 2 |
| 14 - B | 1 | 6T | 5T | - | 1 |
| 14 - C | 2 | 9T | 5T | - | 1 |
| 14 - D | 2 | 6T | 5T | 5T* | 1 |
| 14 - E | 3 | 9T | 8T | - | 1 |
| 14 - F | 1 | 6T | 7T | 6T** | 1 |
| 14 - G | 1 | 6T | 5T + 2TG | 6T** | 1 |
| 14 - H | 1 | 1T | 8T | - | 1 |
| 14 - I | 1 | 2T | 5T | - | 1 |

\* = Bit Compare
\*\* = Bit Store

CAM DEVICE WITH 3D CAM CELLS

INTRODUCTION

The present disclosure relates to semiconductor-based integrated circuits (ICs), and in particular to semiconductor-based ICs having content-addressable memory (CAM) storage elements/cells, CAM devices using one or more storage arrays constructed from the disclosed CAM cells, and associated methods of constructing and/or using such CAM devices.

Random access memory (RAM) instances or storage elements are configured to retrieve or store a data word during a corresponding read or write operation. For instance, the storage element may receive a memory address as an input. In response to the received input, the storage element outputs the data word stored at the input memory address. In contrast, an input to a CAM device having one or more CAM cells comes in the form of a search word. In response to receipt of the search word, the CAM device searches its resident memory registers over a single clock cycle, and thereafter returns a corresponding memory address of one or more memory registers containing matching data. High search speeds enabled by CAM architectures are useful in a wide range of applications, such as but not limited to network switching/packet routing and database searching operations.

SUMMARY

At least some of the representative embodiments described herein extend a multi-tiered or "three-dimensional" (3D) construction to a content-addressable memory (CAM) storage element or CAM cell, as well as to a CAM device constructed from one or more storage arrays of such 3D CAM cells.

According to the present disclosure, the present 3D CAM cell includes multiple levels or tiers of semiconductor dies, including at least first and second die tiers in each of the disclosed alternative embodiments. A semiconductor die as used herein and in the general art is a wafer or block of semiconductor material onto which is fabricated an electrical circuit, e.g., the various traces, connections, transistors, nodes, and other hardware required to form the disclosed circuits. In terms of a relative vertically-stacked position within the CAM cell, the first and second die tiers form lower and upper die tiers, respectively, and are respectively structured as a bit storage cell and a bit comparison cell. That is, hardware arranged on the second die tier performs an XOR (exclusive logical OR) bit comparison function within the CAM cell. As described herein, the arrangement of the constituent XOR logical structure on the second die tier, which itself is coupled to the bit storage cell arranged on the first die tier using a 3D connection, e.g., one 3D connection per die tier, does not adversely affect transistor functionality of the second die tier.

In an exemplary configuration in accordance with the present disclosure, the CAM cell includes the above-noted bit storage cell, bit comparison cell, and 3D connection(s). The bit storage cell is arranged on the first die tier, and includes at least one transistor, one or two bit lines, and a storage node. The bit comparison cell is arranged on a second die tier, with the bit comparison cell having a match line, complementary search lines, and at least three transistors. The complementary search lines are decoupled from the bit line(s) in this particular embodiment. The 3D connection couples the storage node to one of the at least three transistors of the second die tier.

The CAM cell is configured to perform at least one CAM search per clock cycle of a corresponding CAM device, and as many as three parallel CAM searches per clock cycle, with the CAM cell doing so using at least four transistors per CAM search, with transistors of the bit storage cell being static during the search as appreciated in the art. The at least four transistors include the at least one transistor of the bit storage cell and the at least three transistors of the bit comparison cell. The CAM cell ultimately outputs results of the CAM search on the match line, with more than one match line provided in certain configurations.

In another embodiment, a CAM device includes a storage array having a plurality of CAM cells each configured as set forth above. That is, each CAM cell includes a bit storage cell and a bit comparison cell. The bit storage cell is arranged on a first die tier, and includes at least one transistor, one or two bit lines, and a storage node. The bit comparison cell is arranged on a second die tier and has a match line, complementary search lines, and at least three transistors. The complementary search lines are decoupled from the bit line(s). A 3D connection couples the storage node to one of the at least three transistors of the second die tier. The CAM cell is configured to perform at least one CAM search per clock cycle using at least four transistors per search, and to output results of the at least one CAM search on the match line.

The CAM device in this particular embodiment also includes a search register coupled to each of the CAM cells via a respective pair of the complementary search lines, a plurality of match line sense amplifiers coupled to the match line of each of the CAM cells, and an encoder coupled to an output of each of the sense amplifiers. A processor may be included as part of the CAM device or coupled thereto, and configured to control operation of the CAM device.

In still another embodiment, a CAM cell includes a bit storage cell arranged on a first die tier. The bit storage cell includes the noted bit line(s), at least six transistors, and a storage node. The CAM cell also includes a bit comparison cell arranged on a second die tier. The second die tier is coupled to the first die tier by a single first 3D connection, and has complementary search lines, a match line, and at least five transistors. The search lines are decoupled from the bit line(s). In this embodiment, an additional bit storage cell or an additional bit comparison cell is arranged on a third die tier, with the third die tier being coupled to the second die tier by a single second 3D connection, with the term "single" thus referring to the number of 3D connections used to couple one tier to another.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

Implementations of various techniques are described herein with reference to the accompanying drawings. It should be understood, however, that the accompanying drawings illustrate only various implementations of the present teachings, and therefore are not meant to limit the range of possible embodiments.

DETAILED DESCRIPTION

Embodiments described herein provide an efficient architecture and design methodology for a three-dimensional (3D) content-addressable memory (CAM) cell or storage element. As mentioned above, CAM architectures in general lend themselves to a myriad of high-speed access applications. However, such speed advantages come at the expense of increased power consumption and required die area. These and other challenges are addressed via the present teachings.

Figures 1, 2:
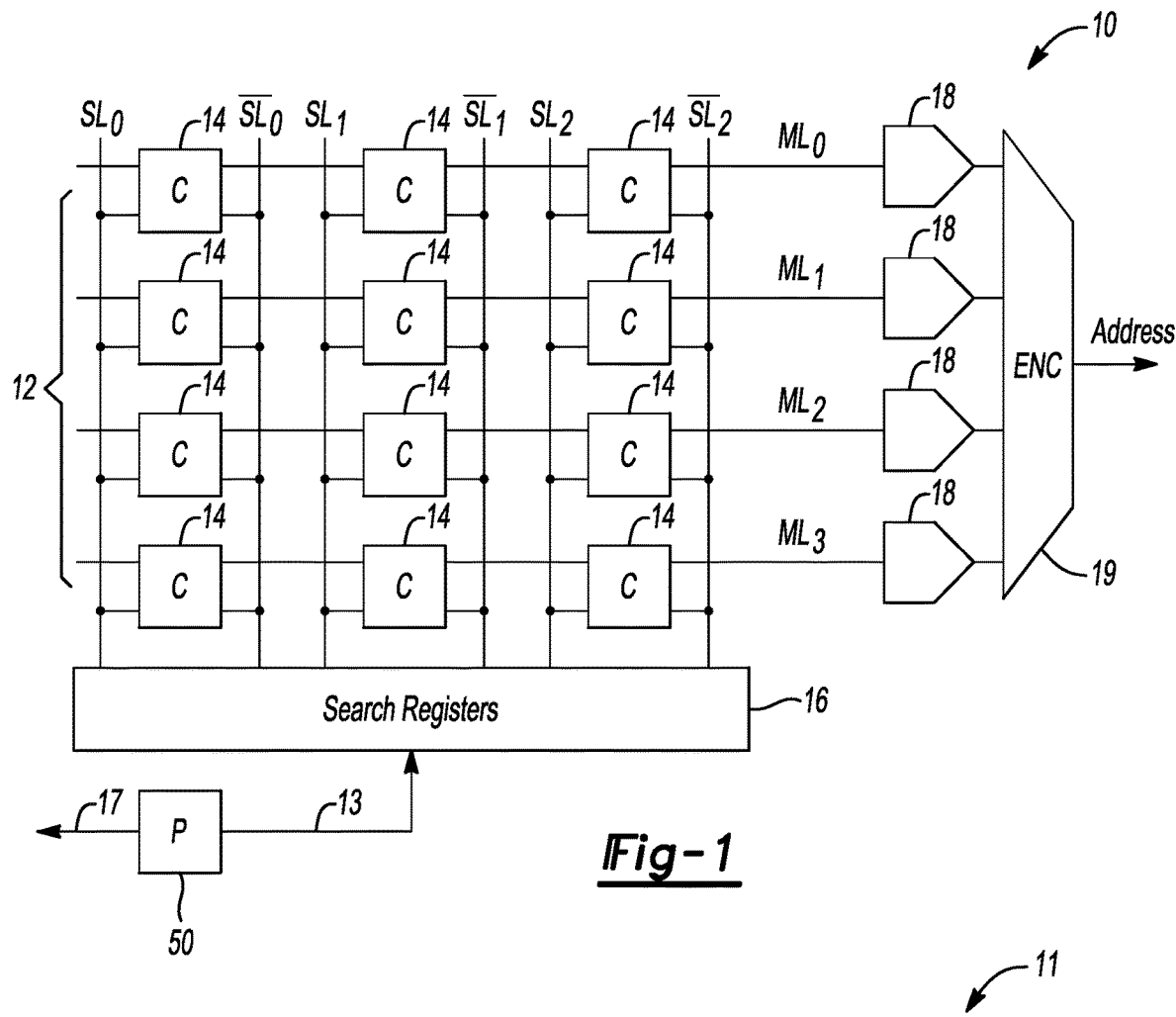
FIG. 1 illustrates a schematic circuit diagram of an exemplary content-addressable memory (CAM) device constructed using three-dimensional (3D) CAM cells as set forth herein.
FIG. 2 is a table describing various 3D CAM cell configurations usable as part of the CAM device shown in FIG. 1.

A representative CAM device 10 is depicted schematically in FIG. 1, with the CAM device 10 having a storage array 12 of an application-appropriate size. Operation of the storage array 12 may be controlled via a microprocessor (P) 50, with the microprocessor 50 being abstracted into a single unit in FIG. 1 for simplicity to show the relevant outputs, i.e., a search word 13 and access control signals 17, e.g., bit line signals, word line signals, selection signals, clock signals, and/or other necessary control signals in the course of performing one or more CAM searches in accordance with the present disclosure.

For the purpose of illustration, CAM search-related structural features are shown in the simplified block circuit schematic of FIG. 1, i.e., bit lines, word lines, and associated bit storage hardware are omitted from FIG. 1 but depicted in FIGS. 4-10. The storage array 12 includes a plurality of 3D CAM cells (C) 14 each having corresponding bit storage and bit comparison hardware arranged on at least two semiconductor die tiers, e.g., Tier0 and Tier1, and possibly a third die tier (Tier2). Each respective one of the CAM cells 14 is provided with a 3D construction in accordance with one of the embodiments summarized in table 11 of FIG. 2.

As will be appreciated by those of ordinary skill in the art, a search register 16 of the CAM device 10 receives a search word (arrow 13) as an input. The search register 16 is coupled to the storage array 12, and thus to each of the several CAM cells 14 residing therein, via a respective pair of complementary differential search lines. Representative pairs of differential search lines are labeled $SL_0$ and $\overline{SL}_0$, $SL_1$ and $\overline{SL}_1$, and $SL_2$ and $\overline{SL}_2$ in the illustrated exemplary configuration, with more or fewer pairs of differential search lines possibly being used in other embodiments based on the size of the storage array 12. Thus, while each CAM cell 14 is described herein as having or including such search lines as well as other lines or conductive traces, the various lines or traces are collectively part of the storage array 12 and CAM device 10, as well as being a part of each constituent CAM cell 14.

As part of the illustrated CAM device 10 of FIG. 1, a corresponding match line $ML_0$, $ML_1$, $ML_2$, or $ML_3$ is coupled to each of the CAM cells 14 of the storage array 12. Again, the number of match lines in an actual embodiment will depend on the configuration and use of the storage array 12, and therefore the particular arrangement of FIG. 1 is intended to be illustrative of the present teachings and non-limiting. A respective match line sense amplifier 18 is coupled to each of the various match lines, with outputs of the sense amplifiers 18 feeding into an encoder (ENC) 19 operating as an encoder. Thus, the input of the search word (arrow 13) into the search register 16, through internal operation of the individual 3D CAM cells 14 as set forth below with reference to FIGS. 2-12, results in output of an address from the encoder 19 when the search word matches a data word in storage array 12.

As will be appreciated by those of ordinary skill in the art, in general a limited number of positive search results or "match cases" are typically produced in a given CAM search. Thus, match line voltage transitions predominate during precharge and match evaluation. In a representative CAM search, loading of a search word (arrow 13) into the search register 16 is followed by precharging of the match lines, e.g., $ML_0$, $ML_2$, $ML_1$, $ML_2$, and $ML_3$. Such an action effectively places the match lines into a match state.

Search line drivers broadcast the search word onto the search lines. In response, each 3D CAM cell 14 compares a respective bit against a bit on the corresponding search lines for that particular 3D CAM cell 14. Due to the transistor arrangement within each 3D CAM cell 14, examples of which are provided in FIGS. 4-10, a voltage discharge occurs on any match line having at least one bit that does not match a bit on the corresponding search line. The sense amplifiers 18 coupled to the particular CAM cell 14 then detects whether its match line has a matching condition. The encoder 19 thereafter maps the match line of a matching location to an encoded address, with the address being output from the CAM device 10 as indicated in FIG. 1. The encoder 19 is also configured to present a single address in response to multiple parallel matches, e.g., the search word matches the same data word stored at several locations. For example, the encoder 19 may present a lowest matching address among several simultaneous matching addresses.

Referring briefly to FIG. 2, table 11 describes various possible configurations of the 3D CAM cells 14 shown schematically as integral parts of the storage array 12 in FIG. 1. The configurations are labeled 14-A through 14-I, with possible corresponding hardware/circuit topologies for each of the configurations being shown in FIGS. 4-12, respectively. In order to implement the present teachings, a particular circuit topology may be chosen to perform either one, two, or three CAM searches in the various examples.

Figure 3:
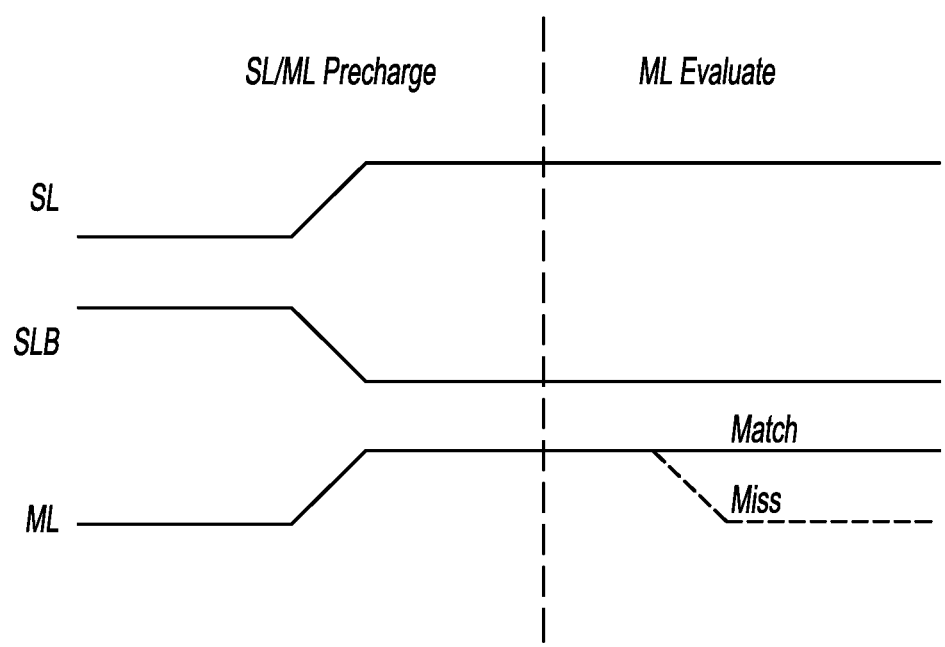
FIG. 3 shows representative search lines and a match line collectively describing operation of one of the 3D CAM cells described herein.

Referring briefly to FIG. 3, each of the configurations 14-A through 14-I operates in a search line/match line (SL/ML) precharge stage in which the respective voltage levels of the match line (ML) and the search line (SL) are set high. The complementary search line, labeled SLB in FIG. 3, is thus set low, i.e., "complementary" referring to the opposite high/low voltage state of the differential pair. During a subsequent match line evaluation stage, after a search word has been broadcast onto the differential search lines SL and SLB, the voltage level of the match line (ML) will remain high when matching data is found during a given search operation of the CAM device 10 shown in FIG. 1. Likewise, the voltage level of the match line is discharged to low voltage/0 level when a match case is not found, with the XOR logic of the constituent CAM cells 14 described herein ensuring such a result.

As listed in table 11 of FIG. 2, the tiered architecture of the 3D CAM cell 14 in accordance with configurations 14-A through 14-I includes at least two die tiers, i.e., Tier0 and Tier1. Configurations 14-D, 14-F, and 14-G also include a third die tier, i.e., Tier2, with the additional die tier being configured to perform either an XOR "bit compare" function or a "bit store" function, as respectively indicated by * or **. The tiers are coupled by one or two 3D connections as indicated in table 11, e.g., through-vias, wafer bonds, or other suitable conductive traces extending between adjacent die tiers. Additionally, each die tier has a corresponding arrangement of a specified number of transistors, which are abbreviated 1T, 3T, 5T, 6T, 7T, 8T, or 9T for simplicity in accordance with convention. Controllable transistor or other semiconductor elements in the form of transmission gates (TG) are also included in the alternative three-tier configuration 14-G. The transmission gates of FIG. 10 (embodied as PMOS and NMOS transistors, or a single NMOS or PMOS transistor) and the pass transistors (FIG. 9) may be thought of as additional transistors of their respective die tiers, and thus counted as additional transistors in the above-noted 7T, 8T, or 9T examples.

The 3D CAM cells 14 contemplated herein, in the various configurations 14-A through 14-I includes a bit storage cell 20 arranged on the first die tier (Tier0), with the bit storage cell 20 in the various embodiments providing the requisite access ports (read/write) for data retrieval and storage functions within the CAM cell 14. The bit storage cell 20 may be embodied as a static RAM (SRAM) cell in some embodiments, with representative dynamic RAM (DRAM) embodiments shown as respective configurations 14-H and 14-I of FIGS. 11 and 12.

Thus, as described in greater detail below with reference to FIGS. 4-12, the bit storage cell 20 includes at least one transistor collectively noted herein as transistors 25, and individually labeled 25A, 25B, 25C, 25D, 25E, and 25F in the various embodiments where added specificity is beneficial. Each bit storage cell 20 also includes and/or is coupled to complementary bit lines (BL, BLB), or to a single bit line (BL) in FIG. 11, a storage (Q) node, and a word line (WL). A bit comparison cell 30 providing XOR logic for performing CAM search operations within each CAM cell 14 is arranged on a second die tier (Tier1) and has a corresponding match line (ML), complementary search lines (SL, SLB), and at least three transistors collectively referred to as transistors 26 (i.e., 26A and 26B for coupling/decoupling to/from the complementary search lines (SL and SLB), respectively, 26C for discharging a pre-charged match line (ML, ML1, or ML2 in different embodiments), transistors 26D and 26E together forming an inverter 22S, etc.). In the various embodiments, the complementary search lines (SL, SLB) are decoupled from the bit line (BL) or the complementary bit lines (BL, BLB), i.e., are not mechanically or electrically connected thereto.

Additionally, as part of the disclosed configurations 14-A through 14-I, at least one three-dimensional (3D) connection 28 such as a wafer-to-wafer bond or conductive via couples the Q node of the first die tier (Tier0) to one of the transistors 26A or 26B of the second die tier (Tier1), with a single 3D connection used to connect adjacent tiers in configurations 14-B through 14-I as shown in table 11 of FIG. 2. The storage element 20 is configured to perform at least one CAM search per clock cycle, e.g., of the CAM device 10 shown in FIG. 1 or other device using the CAM cell 14 as a hardware element. This occurs using at least four transistors per CAM search depending on the embodiment. Results of the CAM search(es) are output on a match line, with multiple match lines used in certain embodiments as set forth below to simultaneously conduct multiple CAM searches. The alternative configurations 14-A through 14-I will now be described with reference to FIGS. 4-12, respectively.

Figure 4:
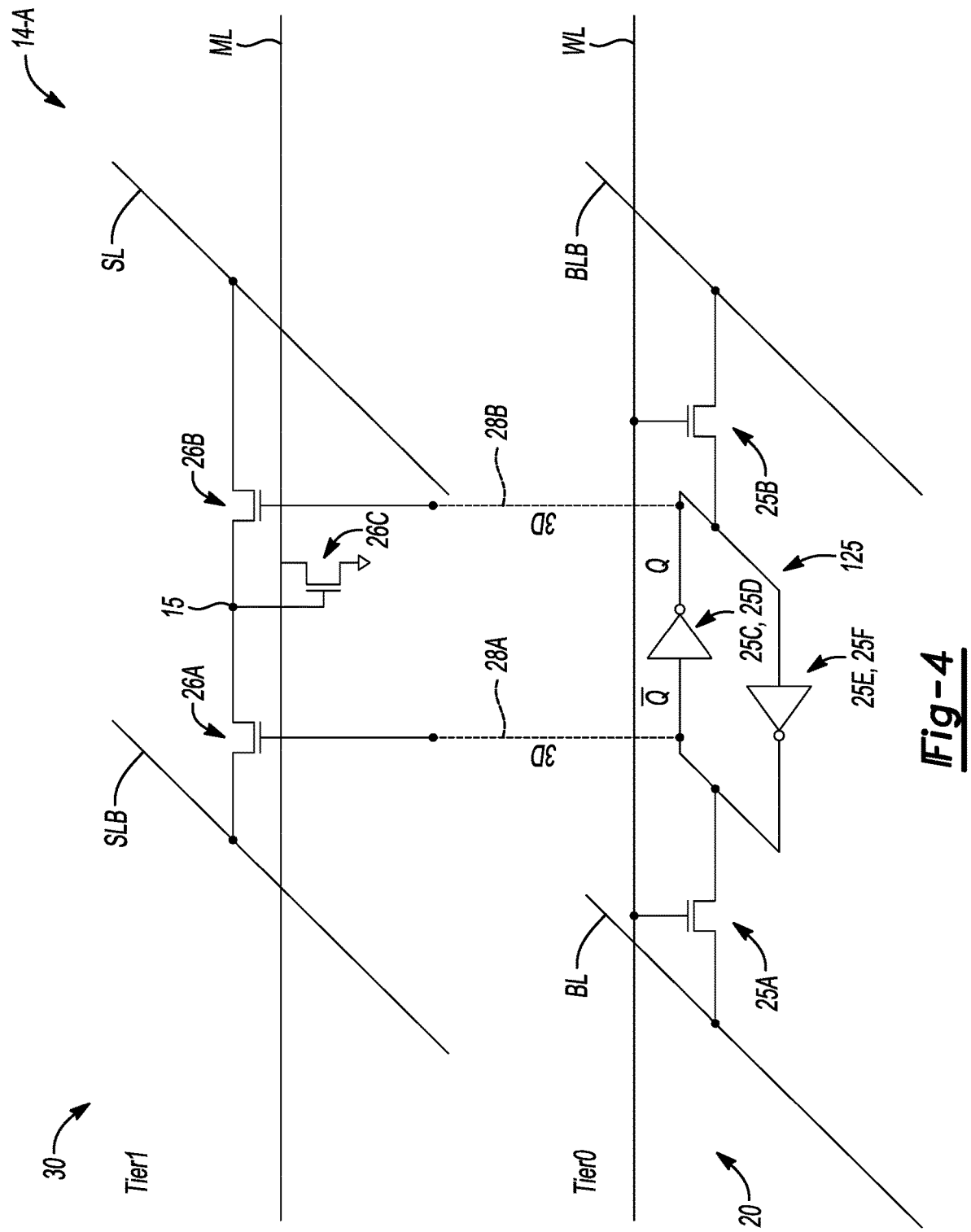
FIGS. 4-12 are schematic circuit diagrams for the alternative 3D CAM cell configurations shown in FIG. 2.

Referring to FIG. 4, configuration 14-A is configured to perform a single CAM search using the above-noted two tiers, i.e., Tier0 and Tier1. Here, the bit storage cell 20 in an SRAM embodiment includes at least six transistors 25, with four of the transistors 25 embodied as two cross-coupled inverters 125, as is well understood in the art. For clarity, the transistors 25 are labeled 25A, 25B, 25C, 25D, and 25F, with transistors 25A and 25B respectively coupled to bit lines BL and BLB. Transistors 25C and 25D along with transistors 25E and 25F form the cross-coupled inverters 125. The storage (Q) node and a complementary Q node (Q) are thus present at opposing ends of the cross-coupled inverters 125.

In this embodiment, a first 3D connection 28A couples the Q node of the bit storage cell 20 to one of the at least three transistors 26 of the bit comparison cell 30 arranged on the second die tier (Tier1), in this instance transistor 26A coupled to search line SLB. A second 3D connection 28B in this embodiment couples the complementary Q node (Q) to another one of the at least three transistors 26 of the bit comparison cell 20, i.e., transistors 26B coupled to sense line SL. A bit match node 15 is thus present on the match line (ML) and coupled to each of the transistors 26 as shown, i.e., the above-noted transistors 26A and 26B along with transistor 26C tied to bit match node 15 used to discharge the match line ML.

In configurations 14-B through 14-E of corresponding FIGS. 5-8, the dual 3D connections 28A and 28B of FIG. 4 are replaced by a single 3D connection 28, i.e., only one 3D connection 28 connects one tier to an adjacent tier. An inverter 22S, which is constructed from two of the transistors 26, i.e., transistors 26D and 26E as appreciated by those of ordinary skill in the art, brings the total number of transistors on the second die tier (Tier1) to at least five (5T+). The bit storage cell 20 arranged on the first die tier (Tier0) is configured to perform one or more CAM searches per clock cycle using the various transistor(s) 25 of the bit storage cell 20 and the five transistors 26 of the bit comparison cell 30. As in all of the embodiments, the word line (WL) and complementary bit lines (BL, BLB) operate as usual during a bit storage function, which function is not affected by the CAM search functions of the CAM cell 14. As shown in table 11 of FIG. 2, the embodiment of FIG. 5 enables one CAM search, with two parallel CAM searches made possible using the alternative configurations 14-C and 14-D of FIGS. 6 and 7, and with three parallel CAM searches made possible using the alternative configuration of FIG. 8.

Figure 5:
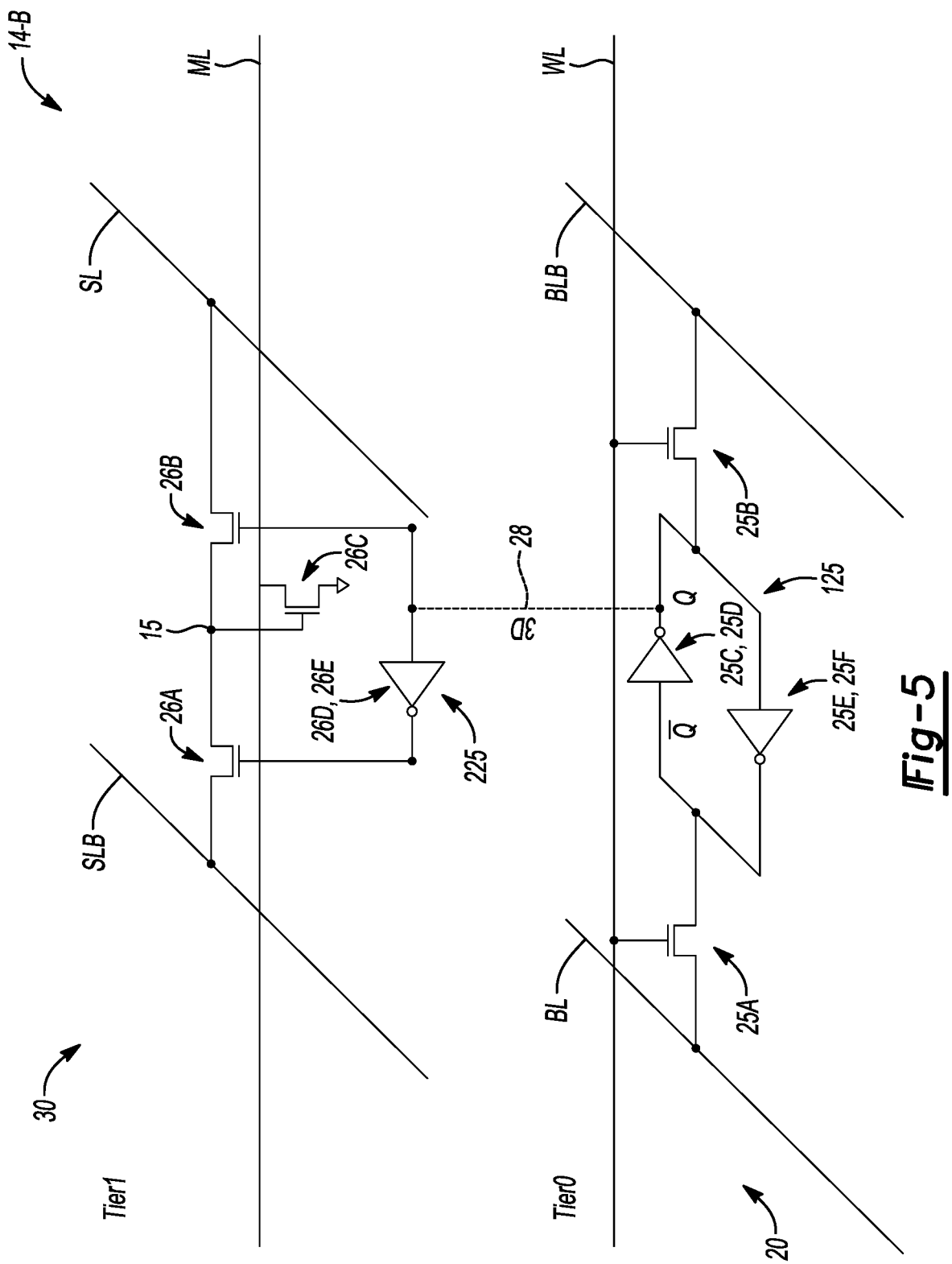
Figure 6:
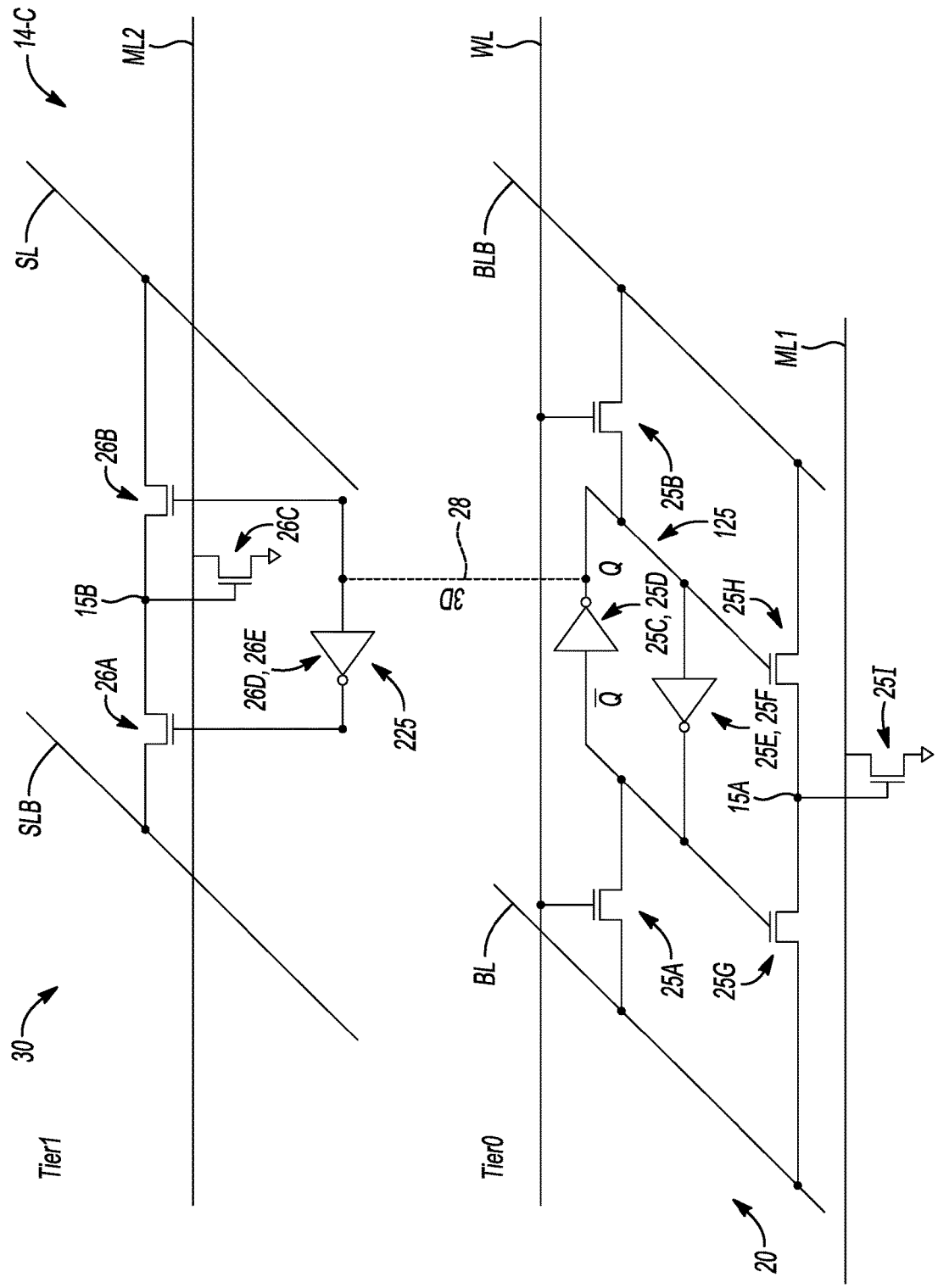

Referring to FIG. 6, the construction of the first die tier (Tier1) in configuration 14-C is identical to that which is shown in FIG. 5. However, configuration 14-C doubles the number of possible CAM searches via the inclusion of three additional transistors 25 on Tier1, which thus creates a hybrid bit storage cell 120 operable for performing bit storage and bit comparison functions. With two concurrent CAM searches, the hybrid bit storage cell 120 now includes a match line ML1 and the bit comparison cell 30 includes a match line ML2, and thus two respective bit match nodes 15A and 15B are present in the circuit.

Figure 7:
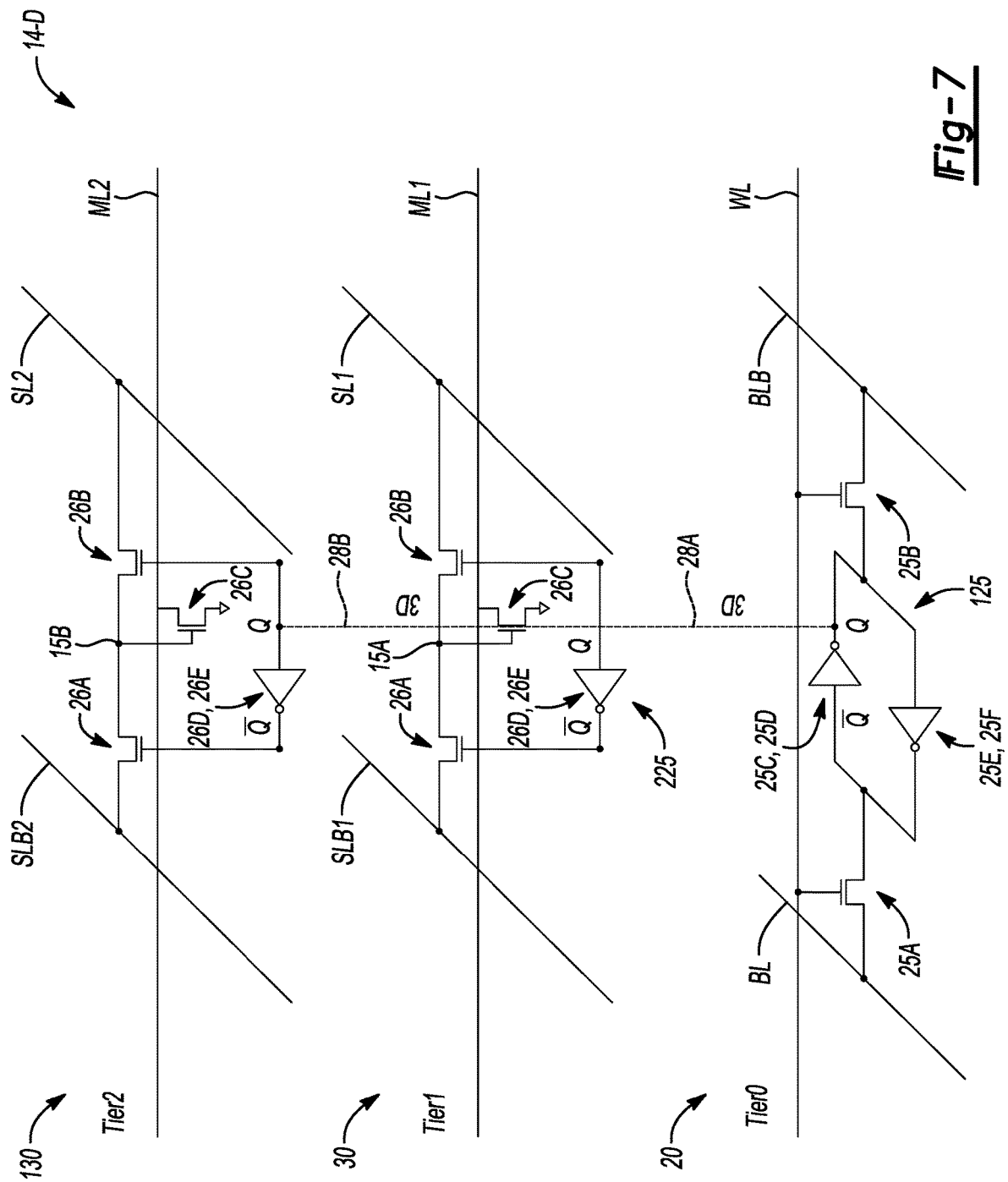
Figure 8:
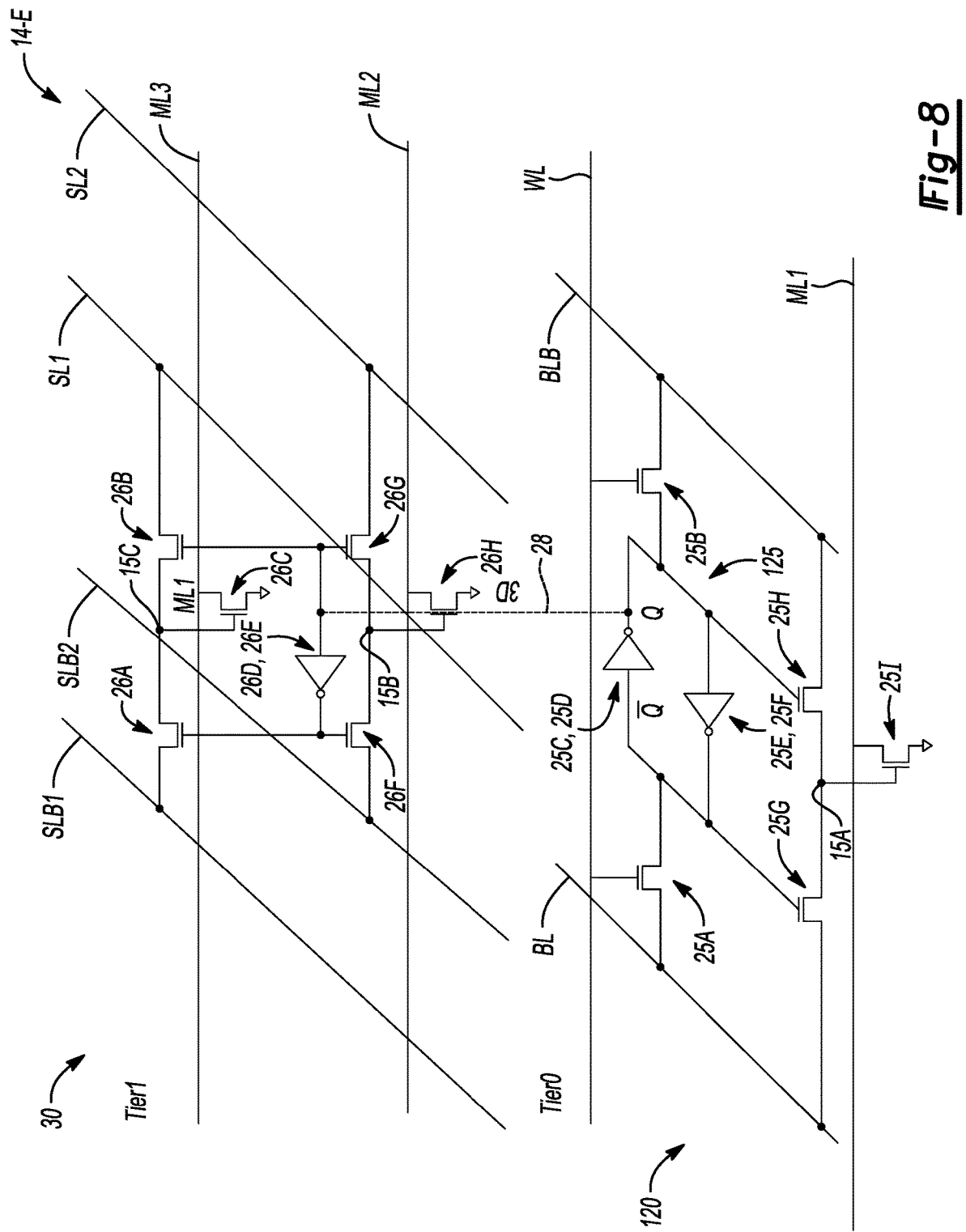

Referring to FIG. 7 and table 11 of FIG. 2, alternative configuration 14-D enables performance of two parallel CAM searches by the addition of a third die tier (Tier2) and another bit comparison cell 130 arranged thereon. In the embodiment of FIG. 7, bit comparison cells 30 and 130 are identically configured, with different reference numbers provided solely for clarity. Outside of the third die tier (Tier2) and the resultant ability to perform a second concurrent CAM search, configuration 14-D is analogous to configuration 14-B of FIG. 5 in its retention of a 6T configuration within the bit storage cell 20 located on the first die tier (Tier0) and the 5T configuration of the bit comparison cells 30 and 130 on the respective second and third die tiers (Tier1 and Tier2).

Additional CAM searches are also possible in accordance with the present teachings without resorting to incorporation of the third die tier (Tier2). For instance, configuration 14-E of FIG. 8 allows for three parallel CAM searches by incorporating XOR logic into a hybrid bit storage cell 120 located on the first die tier (Tier0) similar to FIG. 6, with "hybrid" referring to dual bit storage and bit comparison functionality. In the illustrated embodiment, the hybrid bit storage cell 120 includes a 9T construction, with the additional three transistors 25G, 25H, and 25I relative to configuration 14-D providing a bit comparison function on the first die tier (Tier0). Thus, Tier0 now includes a match line ML1 and a corresponding bit match node 15A.

With respect to the second die tier (Tier1) and the bit comparison cell 30 arranged thereon, two additional match lines ML2 and ML3 with respective bit match nodes 15B and 15C are provided by the illustrated 8T construction. Complementary differential search lines (SL1, SLB1 and SL2, SLB2) are also included in or coupled to the bit comparison cell 30 on the second die tier (Tier1). Relative to configuration 14-D of FIG. 7, that is, three additional transistors 26, i.e., transistors 26F, 26G, and 26H, are provided such that the second die tier (Tier1) has an 8T construction.

Figure 9:
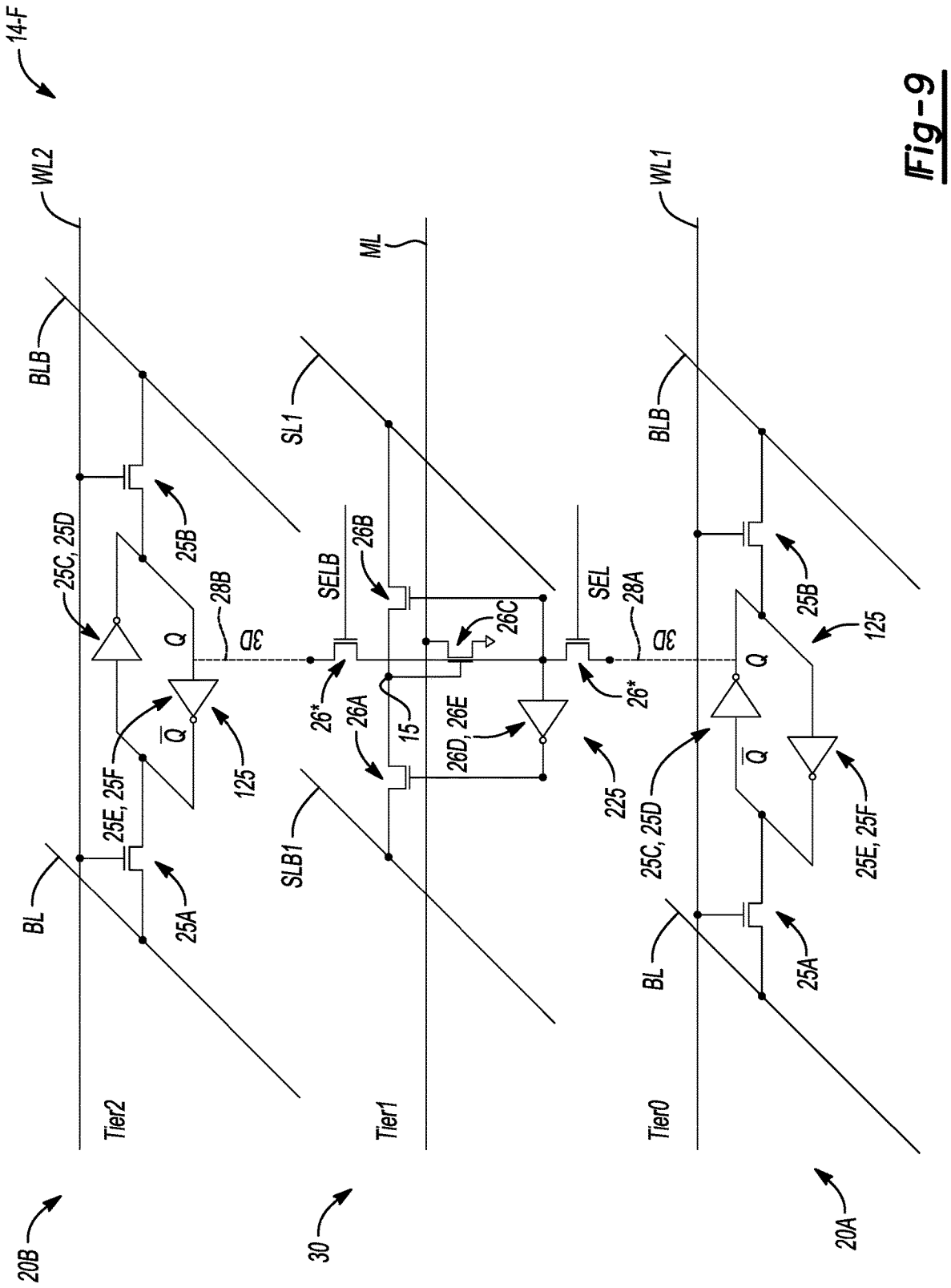
Figure 10:
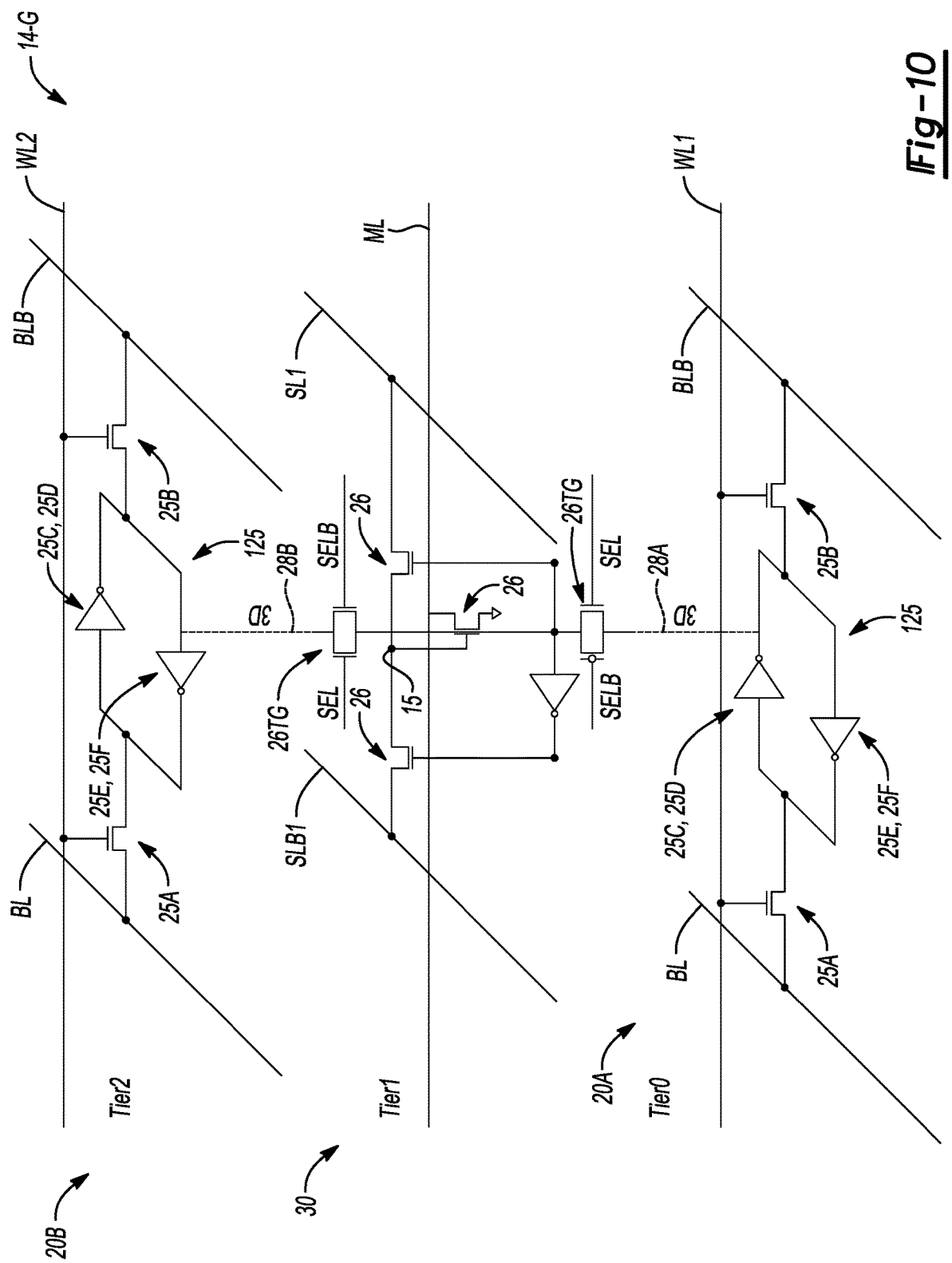

FIGS. 9 and 10 depict two additional three-tiered 3D configurations 14-F and 14-G. Unlike the three-tier construction 14-D shown in FIG. 7 as described above, the third die tier (Tier2) depicted in FIGS. 9 and 10 functions as another bit storage cell 20B, with an identically-configured bit storage cell 20A arranged on the first die tier (Tier0) and configured as set forth above, e.g., with reference to FIG. 4. Thus, configurations 14-F and 14-G include separate word lines (WL1 and WL2) on or coupled to the respective first and second die tiers (Tier0, Tier1).

Configurations 14-F and 14-G differ in their respective constructions by the particular hardware used to couple the intervening second die tier (Tier1) to the respective first and third die tiers (Tier0 and Tier2) effectively "sandwiching" the second die tier (Tier1) therebetween. That is, an ON/OFF state of an actively controllable pass transistor 26* (FIG. 9) or an actively controllable transfer gate 26TG (FIG. 10) is individually controlled using respective selection signal (SEL and SELB), e.g., from the microprocessor 50 of FIG. 1, with the selection signals SEL and SELB being complementary, i.e., opposite. Thus, the "memory sharing" configurations 14-F and 14-G allow for one CAM search to be performed using a selected one of the multiple memory instances in the form of bit storage cells 20A and 20B. By sharing the circuitry of the bit comparison cell 30, such topologies may reduce area.

In an optional embodiment, the CAM cell 14 as described above with reference to the various Figures may be configured, in response to a binary retention signal from the microprocessor 50 of FIG. 1 as part of the control signals (arrow 17) or other suitable control logic, to selectively transition a given die tier supporting a bit storage cell 20 function to a low-power mode. For example, such a signal may temporarily reduce a voltage level to the bit storage cell 20. As will be appreciated, storage structure of a CAM cell 14 only needs to retain its bit value. An access operation, e.g., read/write, is not performed while a CAM search operation is ongoing. Power savings therefore may be enjoyed during such modes by lowering the local power level to the bit storage cell(s) 20 until such time as an access operation is commanded or imminent.

Figure 11:
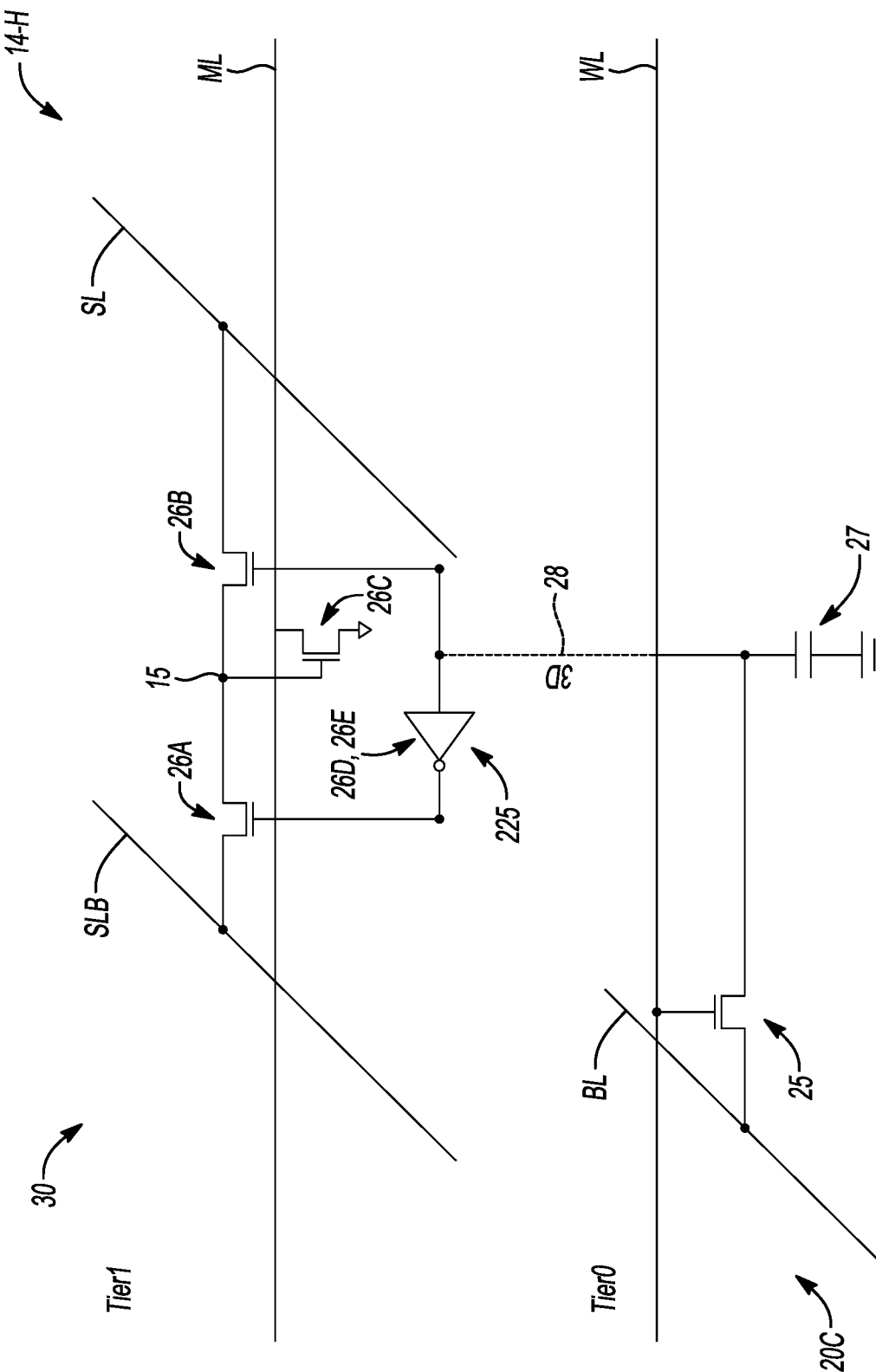

FIG. 11 depicts another possible configuration 14-H for implementing a simplified DRAM instance within a bit storage cell 20C of the first die tier (Tier0), with the above-described configuration of the bit comparison cell 30 (see, e.g., FIG. 5) still arranged on the second die tier (Tier1). In such an embodiment, the bit storage cell 20C includes a single transistor 25 as shown. A capacitor 27 may replace the cross-coupled inverters 125 of FIG. 5. The simplified construction of FIG. 11 may be useful in applications in which SRAM functionality and added complexity is not required.

Figure 12:
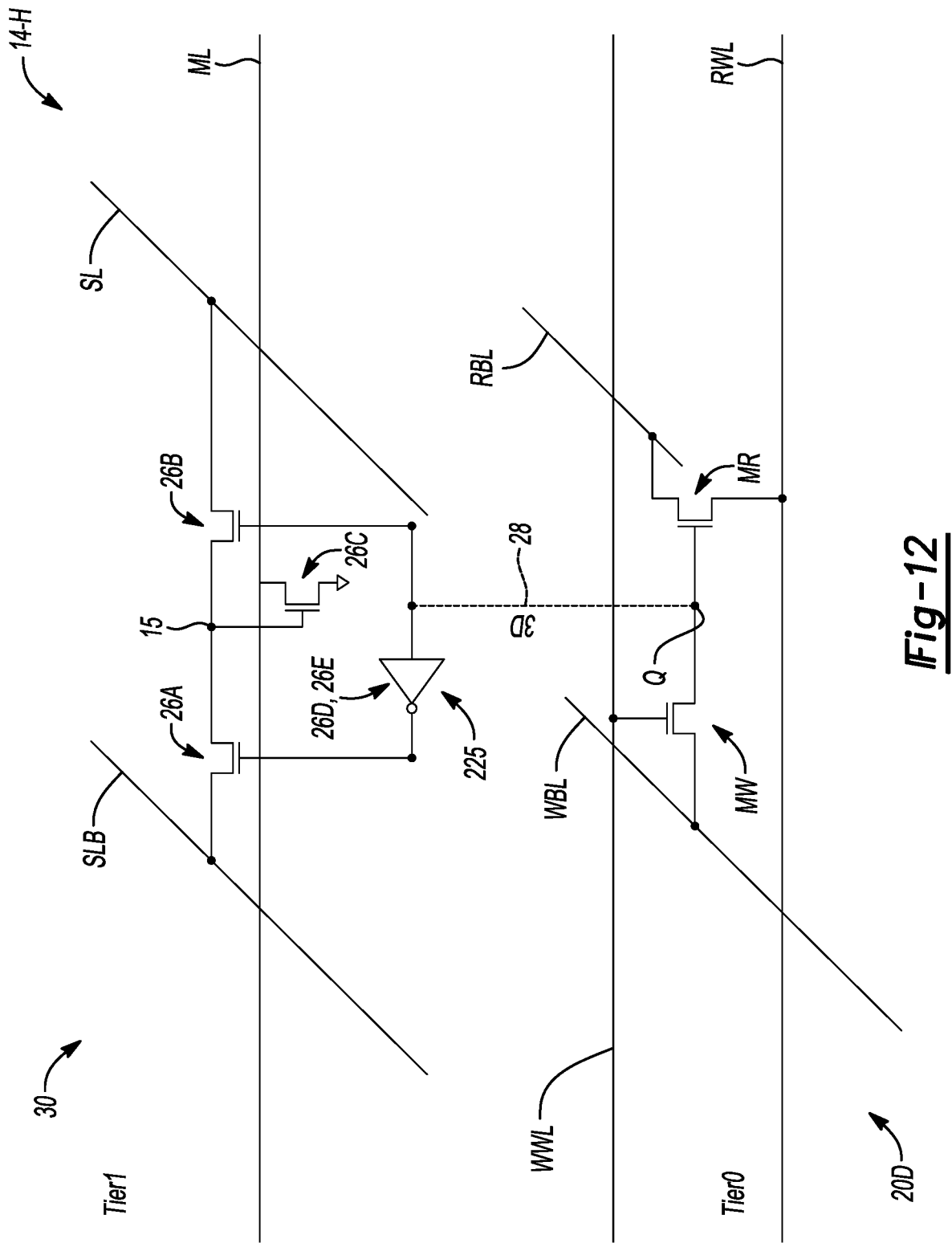

FIG. 12 depicts an alternative DRAM configuration 14-G for implementing an gain cell-embedded DRAM instance (GC-eDRAM) within a bit storage cell 20D of the first die tier (Tier0), with the above-described configuration of the bit comparison cell 30 (see, e.g., FIG. 5) still arranged on the second die tier (Tier1). As will be appreciated by those having ordinary skill in the art, a 6T SRAM uses a complementary pair of bit lines (BL, BLB) as shown in FIGS. 4-10 for READ and WRITE functions. For the DRAM configuration 14-H of FIG. 11, a single bit line (BL) is used for both READ and WRITE functions. For the GC-eDRAM configuration 14-I of FIG. 12, a read bit line (RBL) is used for READ functions and a write bit line (WBL) is used for WRITE functions, i.e., as a 2-port cell, which can support two simultaneous operations, e.g., a READ function at an exemplary address "45" and a WRITE at an exemplary address "23" during the same clock cycle. Transistors MW and MR in the GC-eDRAM configuration 14-I are used as access devices for WRITE and READ functions, respectively. Also, because of the above-noted 2-port nature of the bit storage cell 20D, each bitcell has two word lines, i.e., one for performing WRITE (WWL) functions and one for READ (RWL) functions.

In configuration 14-I of FIG. 12, the write transistor (MW) is coupled to the write bit line (WBL), the read transistor (MR) is coupled to the read bit line (RBL), and a storage (Q) node is located between the respective write and read transistors MW and MR. The 3D connection 28 extends from the Q node to Tier1 in the same manner as is shown in FIG. 11. The write word line (WWL) and the read word line (RWL) are coupled to the respective write and read transistors MW and MR.

In comparison to 6T SRAM and 1T-1C eDRAM instances, the depicted GC-eDRAM implementation may provide certain performance benefits. For example, the 1T-1C eDRAM instance of FIG. 11 may have a small footprint, and therefore its coupling to and use with the second tier (Tier1) in a 3D arrangement may be challenging to implement from a practical standpoint. Thus, the larger footprint of the alternative GC-eDRAM embodiment of FIG. 12 may provide an effective alternative for implementing a DRAM instance in accordance with the present disclosure.

Compared to an SRAM implementation, for example, the GC-eDRAM of FIG. 12 also offers a higher density due to its lower transistor count, low-leakage, and two-ported operation. Compared to a 1T-1C eDRAM instance, the configuration 14-I is fully logic-compatible, and thus does not require additional process steps, and its read operation is non-destructive. While FIG. 12 shows a simplified GC-eDRAM in the form of a 2T gain cell using NMOS transistors, those of ordinary skill in the art will appreciate that other embodiments, e.g., having 3T, 4T, or 5T configurations having NMOS or all PMOS transistors.

While described above in terms of an associated circuit topology, those of ordinary skill in the art will appreciate that methods of constructing and methods of using the above-described configurations 14-A through 14-I are enabled by the foregoing disclosure. By way of example and not limitation, a corresponding method for constructing a CAM cell 14 may include arranging a bit storage cell 20 on the first die tier (Tier0), with the bit storage cell 20 including at least one transistor, one or two bit lines (BL, or BL and BLB, or WBL and RBL), and the storage (Q) node. The method may also include arranging the bit comparison cell 30 on a second semiconductor die tier (Tier1), with the bit comparison cell having a match line (ML), complementary search lines (SL, SLB), and at least three transistors, with the complementary search lines (SL, SLB) being decoupled from the bit line(s) (BL, or BL and BLB, or WBL and RBL). As part of the method, the Q node of the bit storage cell 20 may be coupled to one of the at least three transistors of the second die tier (Tier1) using one or more 3D connections 28, or 28A and 28B, with a single 3D connection 28 extending between adjacent tiers in most embodiments.

Other embodiments may include using any of the above-described constructions to perform at least one CAM search per clock cycle, e.g., of the CAM device 10 shown in FIG. 1, using at least four transistors, including the at least one transistor of the bit storage cell 20 and the at least three transistors of the bit comparison cell 30, and then outputting a match result of the at least one CAM search on the match line (ML).

Still other embodiments may encode instructions for the foregoing CAM search in non-volatile memory, with execution of such instructions by the microprocessor 50 of FIG. 1 or another suitable processing element causing the processor 50 or processing element to perform one or more parallel CAM searches. As an example, such instructions may be triggered in response to receipt of the search word (arrow 17 of FIG. 1) by the search register 16, with the microprocessor 50 in such an embodiment controlling the CAM cell(s) 14 in performance of at least one CAM search per clock cycle of the CAM device 10 using at least four transistors, including the at least one transistor of the bit storage cell 20 and the at least three transistors of the bit comparison cell 30. Execution of such instructions may likewise cause the CAM device 10 to output a match result of the at least one CAM search on the match line (ML). As will be appreciated, a non-transitory computer readable storage medium may store a library cell defining any of the above-described circuits of configurations 14-A through 14-I or alternatives embodiments thereof.

Those of ordinary skill in the art will appreciate that benefits of the present disclosure may be extended to systems or processes using the CAM device 10 of FIG. 1. For instance, in addition to easing of routing congestion provided by configurations 14-A through 14-I, cell area reduction may also enable reductions in word line and sense line length, as well as improved memory timing. Resistive wires or traces such as the match lines ML, ML1, and ML2 shown in the various Figures can potentially be made wider, thereby leading to timing gains. The disclosed 3D architectures of the various configurations shown in FIGS. 4-12 also allows for compact read/write operation of the bit storage cell 20. The present teachings, which are not expected to degrade static noise margins, may thus enable significant power improvements, particularly during CAM search/match operations.

In the present application and in the appended claims, the words "configured to . . . " mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not necessarily imply that the apparatus element needs to be changed in any way in order to provide the defined operation.

It should likewise be understood that, although the terms first, second, etc., are used herein to describe various elements, such elements are not be limited by these descriptive terms. These terms are used herein to distinguish one element from another. For example, a first element could be termed a second element, and vice versa. The first element and the second element are both elements, respectively, but they are not to be considered the same element.

As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

While the best modes for carrying out the present disclosure have been described herein, various alternative designs and embodiments for practicing the disclosure may exist within the scope of the appended claims. Reference has been made in detail to various implementations, examples of which are illustrated in the accompanying drawings and Figures.

What is claimed is:

1. A content-addressable memory (CAM) cell, comprising:
    a bit storage cell arranged on a first die tier, the bit storage cell including at least one transistor, one or two bit lines, and a storage node;
    a bit comparison cell arranged on a second die tier, the bit comparison cell having a match line, complementary search lines, and at least three transistors, wherein the complementary search lines are decoupled from the one or two bit lines; and
    a three-dimensional (3D) connection coupling the storage node to one of the at least three transistors of the second die tier;
    wherein the CAM cell is configured to perform at least one CAM search per clock cycle using at least four transistors, including the at least one transistor of the bit storage cell for a bit storage function and the at least three transistors of the bit comparison cell for a bit comparison function, and to output a match result of the at least one CAM search on the match line,
    wherein the CAM cell is configured to selectively transition the first die tier to a low-power mode in response to a binary retention signal.

2. The CAM cell of claim 1, wherein the bit storage cell includes at least six transistors, the storage node, and a complementary storage node, and wherein the 3D connection includes a first 3D connection coupling the storage node to one of the at least three transistors of the bit comparison cell, and a second 3D connection coupling the complementary storage node to another one of the at least three transistors of the bit comparison cell.

3. The CAM cell of claim 1, wherein the bit comparison cell includes five transistors, and the CAM cell is configured to perform the at least one CAM search per clock cycle using the at least one transistor of the bit storage cell and the five transistors of the bit comparison cell.

4. The CAM cell of claim 1, further comprising: an additional bit comparison cell or an additional bit storage cell arranged on a third die tier of the CAM cell and coupled to the bit comparison cell.

5. The CAM cell of claim 4, wherein the third die tier is coupled to the first die tier and the second die tier by a respective transistor element having a selectable ON/OFF state that is responsive to a selection signal, the respective transistor element being a pass transistor or a transmission gate.

6. The CAM cell of claim 5, wherein the transistor element is a pass transistor or a transmission gate.

7. The CAM cell of claim 1, wherein the bit storage cell is a gain-cell embedded DRAM (GC-eDRAM) cell.

8. The CAM cell of claim 1, wherein the 3D connection is a single 3D connection.

9. The CAM cell of claim 1, wherein the bit storage cell is an SRAM cell.

10. The CAM cell of claim 1, further comprising: an additional bit comparison cell arranged on a third die tier, and having an additional match line, additional complementary search lines, and at least three additional transistors, wherein the 3D connection is coupled to one of the at least three additional transistors of the third die tier.

11. A content-addressable memory (CAM) device comprising:
a storage array having a plurality of CAM cells, each CAM cell including:
a bit storage cell arranged on a first die tier, the bit storage cell including at least one transistor, one or two bit lines, and a storage node;
a bit comparison cell arranged on a second die tier, the bit comparison cell having a match line, complementary search lines, and at least three transistors, wherein the complementary search lines are decoupled from the one or two bit lines;
an additional bit comparison cell or an additional bit storage cell arranged on a third die tier and coupled to the bit comparison cell arranged on the second die tier; and
a three-dimensional (3D) connection coupling the storage node to one of the at least three transistors of the second die tier, wherein each respective one of the CAM cells is configured to perform at least one CAM search per clock cycle using at least four transistors per search, and to output results of the at least one CAM search on the match line;
a search register coupled to each of the plurality of CAM cells via a respective pair of the complementary search lines;
a plurality of sense amplifiers coupled to the match line of each of the CAM cells; and
an encoder coupled to an output of each of the plurality of sense amplifiers.

12. The CAM device of claim 11, wherein the bit storage cell includes at least six transistors, the storage node, and a complementary storage node, and wherein the 3D connection includes a first 3D connection coupling the storage node to the one of the at least six transistors of the second die tier, and a second 3D connection coupling the complementary storage node to another one of the at least six transistors of the second die tier.

13. The CAM device of claim 11, wherein the bit comparison cell includes five transistors, and each of the CAM cells is configured to perform the at least one CAM search per clock cycle using at least six transistors per search, including the at least one transistor of the bit storage cell and the five transistors of the bit comparison cell.

14. The CAM device of claim 11, wherein each respective one of the CAM cells is configured, in response to a binary retention signal, to transition the first die tier to a low-power mode.

15. The CAM device of claim 11, further comprising: the additional bit comparison cell arranged on the third die tier, wherein the additional bit comparison cell includes an additional match line, additional complementary search lines, and at least three additional transistors, and wherein the 3D connection is also coupled to one of the at least three additional transistors of the third die tier.

16. The CAM device of claim 15, further comprising: the additional bit storage cell arranged on the third die tier, wherein the bit comparison cell is disposed between the bit storage cell of the first die tier and the additional bit storage cell of the third die tier, and wherein the bit comparison cell is selectively coupled to the bit storage cell and the additional bit storage cell via a corresponding transmission gate.

17. A content-addressable memory (CAM) cell comprising:
a bit storage cell arranged on a first die tier, the bit storage cell including one or two bit lines, at least six transistors, and a storage node;
a bit comparison cell arranged on a second die tier that is coupled to the first die tier by a single first three-dimensional (3D) connection, and having complementary search lines, a match line, and at least five transistors, wherein the search lines are decoupled from the bit lines; and
an additional bit storage cell arranged on a third die tier, the third die tier being coupled to the second die tier by a single second 3D connection, wherein each of the bit storage cell and the additional bit storage cell includes six transistors, the bit comparison cell includes five transistors, the first die tier is selectively coupled to the second die tier by a first transmission gate or a first pass transistor, and the second die tier is selectively coupled to the third die tier by a second transmission gate or a second pass transistor.

18. The CAM device of claim 11, wherein the third die tier is coupled to the first die tier and the second die tier by a respective transistor element having a selectable ON/OFF state that is responsive to a selection signal, the respective transistor element being a pass transistor or a transmission gate.

19. The CAM device of claim 11, wherein the bit storage cell is a gain-cell embedded DRAM (GC-eDRAM) cell.

20. The CAM cell of claim 17, wherein the bit storage cell is a gain-cell embedded DRAM (GC-eDRAM) cell.

* * * * *